United States Patent
Ng et al.

(10) Patent No.: US 11,429,848 B2
(45) Date of Patent: Aug. 30, 2022

(54) HOST-DIRECTED MULTI-LAYER NEURAL NETWORK PROCESSING VIA PER-LAYER WORK REQUESTS

(71) Applicant: Xilinx, Inc., San Jose, CA (US)

(72) Inventors: Aaron Ng, San Jose, CA (US); Elliott Delaye, San Jose, CA (US); Jindrich Zejda, Saratoga, CA (US); Ashish Sirasao, San Jose, CA (US)

(73) Assignee: XILINX, INC., San Jose, CA (US)

( * ) Notice: Subject to any disclaimer, the term of this patent is extended or adjusted under 35 U.S.C. 154(b) by 954 days.

(21) Appl. No.: 15/786,102

(22) Filed: Oct. 17, 2017

(65) Prior Publication Data

US 2019/0114538 A1   Apr. 18, 2019

(51) Int. Cl.
*G06N 3/04*   (2006.01)
*G06N 3/063*   (2006.01)

(52) U.S. Cl.
CPC ........... *G06N 3/063* (2013.01); *G06N 3/0454* (2013.01)

(58) Field of Classification Search
CPC .............................. G06N 3/063; G06N 3/0454
USPC .......................................................... 706/41
See application file for complete search history.

(56) References Cited

U.S. PATENT DOCUMENTS 6,346,825 B1   2/2002   Pang et al.

| | | | |
|---|---|---|---|
| 2008/0262984 A1* | 10/2008 | Xu | G06F 16/334 706/12 |
| 2016/0196488 A1* | 7/2016 | Ahn | G06N 3/049 706/41 |
| 2018/0089562 A1* | 3/2018 | Jin | G06F 17/18 |

OTHER PUBLICATIONS

An Open Source Neural Networks C++ Library (Year: 2010).*
Going Deeper with Embedded FPGA Platform for Convolutional Neural Network (Year: 2016).*
Goind Deeper with Embedded FPGA Platform for Convolutional Neural Network (Year: 2016).*
Flexible On-chip Memory Architecture for DCNN Accelerators (Year: 2017).*
An Open Source Neural Netowrorks C++ Library (Year: 2010).*
(Continued)

*Primary Examiner* — Omar F Fernandez Rivas
*Assistant Examiner* — Em N Trieu
(74) *Attorney, Agent, or Firm* — Crawford Maunu PLLC

(57) ABSTRACT

In disclosed approaches of neural network processing, a host computer system copies an input data matrix from host memory to a shared memory for performing neural network operations of a first layer of a neural network by a neural network accelerator. The host instructs the neural network accelerator to perform neural network operations of each layer of the neural network beginning with the input data matrix. The neural network accelerator performs neural network operations of each layer in response to the instruction from the host. The host waits until the neural network accelerator signals completion of performing neural network operations of layer i before instructing the neural network accelerator to commence performing neural network operations of layer i+1, for i≥1. The host instructs the neural network accelerator to use a results data matrix in the shared memory from layer i as an input data matrix for layer i+1 for i≥1.

14 Claims, 9 Drawing Sheets

(56) References Cited

OTHER PUBLICATIONS

Flexible On chip Memory Architecture for DCNN Accelerator (Year: 2017).*
Chetlur, Sharan et al., "cuDNN: Efficient Primitives for Deep Learning," submitted Oct. 3, 2014, pp. 1-9, https://arxiv.org/pdf/1410.0759.pdf, Cornell University Library.
Di Carlo, Stefano et al., "An Area-Efficient 2-D Convolution Implementation on FPGA for Space Applications," Proc. of the 2011 IEEE 6th International Design & Test Workshop, Dec. 11, 2011, pp. 88-92, IEEE, Piscataway, New Jersey, USA.
Gysel, Philipp, "Ristretto: Hardware-Oriented Approximation of Convolutional Neural Networks," May 20, 2016, pp. 1-73, https://arxiv.org/abs/1605.06402, Cornell University Library.
Khronos, "clSetKernelArg," downloaded Sep. 22, 2017 from https://www.khronos.org/registry/OpenCL/sdk/1.0/docs/man/xhtml/clSetKernelArg.html, copyright 2007, pp. 1-4, Khronos Group, Beaverton, Oregon, USA.
Krizhevsky, Alex et al., "ImageNet Classification with Deep Convolutional Neural Networks," Proc. of the 12th International Conference on Neural Processing Systems, Dec. 3, 2012, pp. 1097-1105, ACM Digital Library, www.acm.org.
Mathworks, "im2col," dowloaded Sep. 22, 2017 from https://www.mathworks.com/help/images/ref/im2col.html?searchHighlight=im2col&s_tid=doc_srchtitle, pp. 1-3.
Saxena, Abhineet, "Convolutional Neural Networks (CNNs): An Illustrated Explanation," Jun. 20, 2016, downloaded Sep. 25, 2017 from http://xrds.acm.org/blog/2016/06/convolutional-neural-networks-cnns-illustrated-explanation/, pp. 1-15.
Shaaban, Muhammed, "Systolic Architectures," Mar. 11, 2003, Kate Gleason College of Engineering, Rochester Institute of Technology, Rochester, New York, USA.
Warden, Pete, "Why GEMM is at the heart of deep learning," Apr. 20, 2015, pp. 1-9, downloaded from https://petewarden.com/2015/04/20/why-gemm-is-at-the-heart-of-deep-learning/.
Wikipedia, "Convolutional neural network," Sep. 20, 2017, pp. 1-13, downloaded from https://en.wikipedia.org/wiki/Convolutional_neural_network.
Wikipedia, "Deep learning," Sep. 24, 2017, pp. 1-13, downloaded from https://en.wikipedia.org/wiki/Deep_learning.
Wikpedia, "Matrix Multiplication," Sep. 20, 2017, pp. 1-19, downloaded from https://en.wikipedia.org/wiki/Matrix_multiplication.
Wikipedia, "Multiprocessing," May 10, 2017, pp. 1-4, dowloaded from https://en.wikipedia.org/wiki/Multiprocessing.
Wikipedia, "Producer-consumer problem," Sep. 7, 2017, pp. 1-9, downloaded from https://en.wikipedia.org/wiki/Producer%E2%80%93consumer_problem.
Wikipedia, "Row- and colum-major order," Aug. 23, 2017, pp. 1-5, downloaded from https://en.wikipedia.org/wiki/Row-_and_column-major_order.
Wikipedia, "Systolic array," Mar. 22, 2017, pp. 1-5, downloaded from https://en.wikipedia.org/wiki/Systolic_array.
Wikipedia, "Very long instruction word," Jul. 13, 2017, pp. 1-3, downloaded from https://en.wikipedia.org/wiki/Very_long_instruction_word.
Xilinx, "Smarter Data Center," downloaded Sep. 22, 2017 from https://www.xilinx.com/applications/data-center.html, pp. 1-4, Xilinx, Inc., San Jose, California, USA.
Xilinx, "SDSoC Development Environment," downloaded Sep. 22, 2017 from https://www.xilinx.com/products/design-tools/software-zone/sdsoc.html, pp. 1-16, Xilinx, Inc., San Jose, California, USA.
Xilinx, "UltraScale Architecture DSP Slice User Guide," UG579 (v1.3), Nov. 24, 2015, pp. 1-74, Xilinx, Inc., San Jose, California, USA.
Xilinx, "Vivado High-Level Synthesis," downloaded Sep. 22, 2017 from https://www.xilinx.com/products/design-tools/vivado/integration/esl-design.html, pp. 1-2, Xilinx, Inc., San Jose, California, USA.
Xilinx, "Deep Learning with INT8 Optimization on Xilinx Devices," WP486 (v1.0.1), Apr. 24, 2017, pp. 1-11, Xilinx, Inc., San Jose, California, USA.
Xilinx, "Implementing Memory Structures for Video Processing in the Vivado HLS Tool," XAPP793 (v1.0), Sep. 20, 2012, pp. 1-8, Xilinx, Inc., San Jose, California, USA.
Xilinx, "Two-Dimensional Linear Filtering," XAPP933 (v1.1), Oct. 23, 2007, pp. 1-8, Xilinx, Inc., San Jose, California, USA.
Azizimazreah, Arash et al., "Flexible On-Chip Memory Architecture for DCNN Accelerators," Proc. of the First International Workshop on Architectures for Intelligent Machines, Sep. 10, 2017, pp. 1-6.
Brown, III, D.R., "Pre-Scaling to Avoid Overflow and Maintain Maximum Precision in Fixed-Point Multiplication," Nov. 10, 2011, pp. 1-5, retrieved from https://spinlab.wpi.edu/courses/ece4703_2011/fpmultiplication.pdf.
Li, Zhen et al., "A Survey of Neural Network Accelerators," Frontiers of Computer Science, May 17, 2017, pp. 746-761, vol. 11, Springer Berlin, Berlin/Heidelberg, Germany.
Qiu, Jiantao et al., "Going Deeper with Embedded FPGA Platform for Convolutional Neural Networks," Proc. of the 2016 ACM/SIGDA International Symposium on Field-Programmable Gate Arrays, Feb. 21, 2016, pp. 26-35, ACM Press, New York, New York, USA.
Shen, Yongmin et al., "Mazimizing CNN Accelerator Efficiency Through Resource Partitioning," Proc. of the 44th Annual International Symposium on Computer Architecture, Jun. 24, 2017, pp. 535-547, ACM Press, New York, New York, USA.

* cited by examiner

HOST-DIRECTED MULTI-LAYER NEURAL NETWORK PROCESSING VIA PER-LAYER WORK REQUESTS

TECHNICAL FIELD

The disclosure generally relates to neural network processing.

BACKGROUND

Machine learning is the science of inducing computing systems to act without being explicitly programmed. Classical machine learning includes various clustering and classification techniques, including K-means clustering, linear and logistic regressions, stochastic gradient decent, association rule learning, and the like. Deep learning is a newer frontier in machine learning. Deep learning is a class of machine learning algorithms that uses multiple layers of nonlinear processing units for feature extraction and transformation. Deep learning algorithms can be unsupervised (e.g., pattern analysis) or supervised (e.g., classification). The deep learning algorithm can be implemented using layers of an artificial neural network (ANN) (referred to herein as a "neural network").

In general, a neural network is a collection of nodes (i.e., the "neurons") that are connected in a graph. A node in a neural network computes a sum of weighted inputs and adds an optional bias to the sum. The output of the node is a function of the final sum (referred to as an "activation function"). Example activation functions include the sigmoid function, the hyperbolic tangent (tan h) function, the Rectified Linear Unit (ReLU) function, and the identity function. Neural network models are often organized into layers of nodes, which define a specific topology, and corresponding weights and biases. The weights and biases are referred to as network parameters.

In general, a neural network includes an input layer and an output layer and can optionally include one or more hidden layers between the input and output layers. A neural network used in deep learning applications typically includes many hidden layers, which gives rise to the term deep neural network (DNN). The layers of a neural network can be densely connected (e.g., each node in a layer is fully connected to all nodes in a previous layer) or sparsely connected (e.g., each node in a layer is connected to only a portion of the nodes in a previous layer). A convolutional neural network (CNN) is a type of DNN that includes one or more sparsely connected layers, referred to as convolutional layers. A CNN is well-suited for processing image or video data. Other types of DNNs include recurrent neural network (RNNs), which are well-suited for processing speech and text data.

Field programmable gate arrays (FPGAs) have been used to implement circuits that accelerate functions called from software. Circuits that accelerate functions called from software are referred to as hardware accelerators. Examples of hardware accelerators include various image filters implemented as FPGA circuits that can be called from image processing software.

A hardware accelerator-based implementation of a neural network (NN) involves the transfer by a host computer system of the weights and input data to memory that is accessible to the hardware accelerator, and the transfer of output data to a host computer system. The transfer of data between the host computer system and the shared memory can degrade performance. Compared to other commonly used NN implementations such as on a CPU or a GPU, a hardware accelerator-based implementation can be advantageous because an FPGA circuit can process data faster than a GPU and consume less power in the process.

SUMMARY

In a disclosed method of neural network processing, a host computer system copies an input data matrix from host memory to a shared memory for performing neural network operations of a first layer of a neural network by a neural network accelerator. The host instructs the neural network accelerator to perform neural network operations of each layer of the neural network beginning with the input data matrix. The neural network accelerator performs neural network operations of each layer in response to the instruction from the host. The host waits until the neural network accelerator signals completion of performing neural network operations of layer i before instructing the neural network accelerator to commence performing neural network operations of layer i+1, for i≥1. The host instructs the neural network accelerator to use a results data matrix in the shared memory from layer i as an input data matrix for layer i+1 for i≥1.

A disclosed neural network processing system includes a shared memory and a host computer system and a neural network accelerator coupled to the shared memory. The host is configured to copy an input data matrix from host memory to the shared memory for performing neural network operations of a first layer of a neural network by the neural network accelerator. The host instructs the neural network accelerator to perform neural network operations of each layer of the neural network beginning with the input data matrix. The host then waits until neural network accelerator signals completion of performing neural network operations of layer i before instructing the neural network accelerator to commence performing neural network operations of layer i+1, for i≥1. The host instructs the neural network accelerator to use a results data matrix in the shared memory from layer i as an input data matrix for layer i+1 for i≥1. The neural network accelerator is configured to perform neural network operations of each layer of the neural network by the neural network accelerator in response to instruction by the host.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

Figure 1:
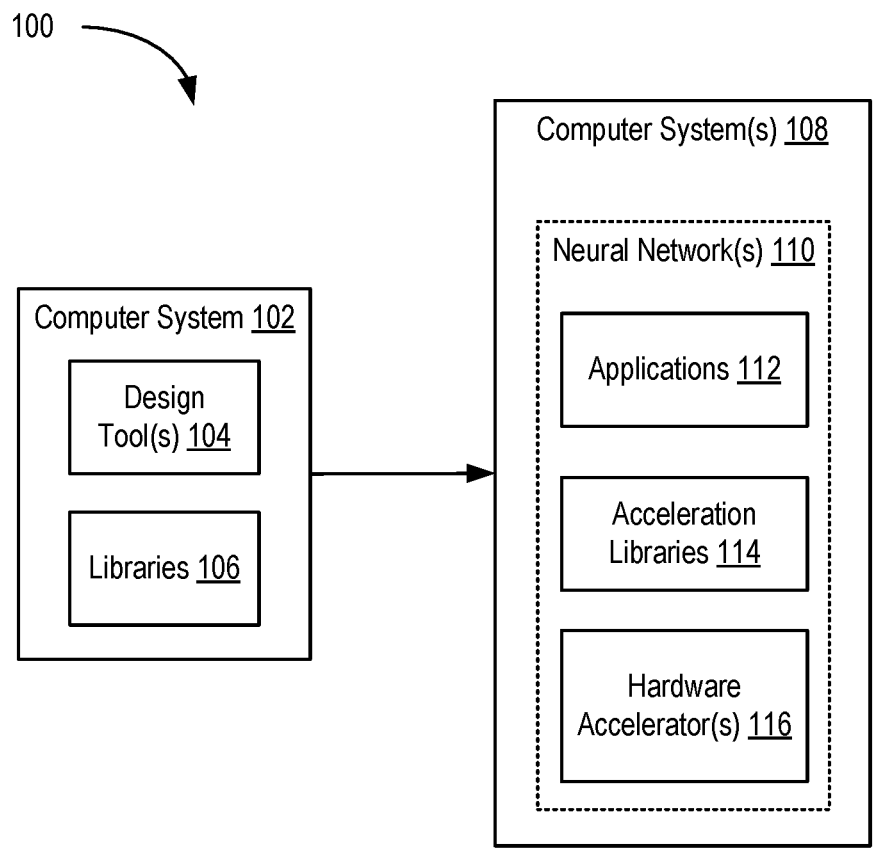
FIG. 1 is a block diagram depicting a system for implementing neural networks according to an example.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and systems are applicable to convolutional neural networks (CNNs), recurrent neural networks (RNNs) and other neural networks involving operations such as matrix multiplication or convolution. For brevity, the host computer system may also be referred to as a "host," and a neural network accelerator may also or alternatively be referred to as an "acceleration circuit," a "kernel accelerator" or a "kernel accelerator circuit."

An exemplary application of the disclosed systems and methods is a convolutional neural network (CNN). A CNN can be represented as a directed graph having layers of operations. Each layer can entail one or more operations, such as CONV (Convolution), or image-to-column conversion ("im2col"), general matrix multiplication ("GEMM"), activation (e.g., a rectified linear unit, "RELU" function), pooling (e.g., "maxpool"), local response normalization (LRN layer), and inner product (e.g., "fully connected" (FC) layer). The inputs to each layer are data, such as images or voice samples, and trained weights, all represented as matrices.

In order to reduce the time spent transferring data between the host and neural network accelerator and improve system performance, some implementations of NNs consolidate as much processing as possible in the neural network accelerator. A finite state machine (FSM) on the neural network accelerator controls the execution of the operations of the layers of the NN on these implementations. The FSM, however, can be very complicated and difficult to debug as a circuit on the neural network accelerator. In the disclosed approaches, instead of a complex FSM on the neural network accelerator, the host successively invokes the neural network accelerator for each layer of the NN. The results of all the layers, except the last layer, are stored and maintained on the neural network accelerator and made available for input to the next layer. The host need only provide the control parameters to the neural network accelerator as the host invokes the neural network accelerator to perform the functions of each layer.

In one implementation, the host copies an input data matrix from host memory to a memory that is shared with a neural network accelerator. The host instructs the neural network accelerator to perform operations of the first layer of a neural network on the input data matrix. The neural network accelerator performs the neural network operations of each layer in response to initiation from the host, and the host waits until the neural network accelerator signals completion of performing the operations of one layer before instructing the neural network accelerator to commence performing the neural network operations of the next layer. In response to the neural network accelerator signaling completion of the operations of a layer, the host instructs the kernel to use the results data generated by the previous layer and stored in the shared memory as the input data matrix to the next layer, which avoids time-consuming transfer of data between the host and neural network accelerator.

FIG. 1 is a block diagram depicting a system 100 for implementing neural networks according to an example. The system 100 includes a computer system 102 and one or more computer systems 108. The computer system 102 includes conventional computing components configured to execute software that provides one or more design tools 104. Each computer system 108 implements one or more neural networks 110. The neural network(s) 110 are implemented using applications 112, acceleration libraries 114, and one or more hardware accelerators 116.

In an example, the hardware accelerator(s) 116 include programmable integrated circuits (ICs), such as field programmable gate arrays (FPGAs). The acceleration libraries 114 provide application programming interfaces (APIs) to interface with the hardware accelerator(s) 116. The acceleration libraries 114 can also include libraries that provide neural network functions, including predefined and optimized implementations of neural network layers and other types of neural network structures. Thus, the neural network(s) 110 can include both hardware portions implemented in the hardware accelerator(s) 116, as well as software portions implemented in the acceleration libraries 114. The applications 112 invoke the APIs of the acceleration libraries 114 to program and control the hardware accelerator(s) 116 to implement the neural network(s) 116.

A designer interacts with the design tool(s) 104 to define the neural network(s) 110. The design tool(s) 104 can generate files for programming the hardware accelerator(s) 116 (e.g., configuration bitstreams for FPGAs), files that provide the acceleration libraries 114, and files that provide the applications 112. The designer can define the hardware portions of the neural network(s) 110 using a register transfer language (RTL) or using a programming language, such as C, C++, OpenCL, and the like, or a combination of RTL and programmable language(s). The user can define the software portions of the neural network(s) 110 using a programming language, such as C, C++, OpenCL, etc. The design tool(s) 104 compile the software-defined neural networks to generate files for programming the hardware accelerator(s) 116 and library files for the acceleration libraries 114. The designer can make use of libraries 106 that provide class libraries, template libraries, and the like to assist in developing the hardware and software portions of the neural network(s) 110.

A user can define the applications 112 using a programming language (e.g., C, C++, Python, etc.). The user can make use of neural network frameworks and libraries, such as Caffe, TENSORFLOW™, MXNet, and the like.

Figure 2:
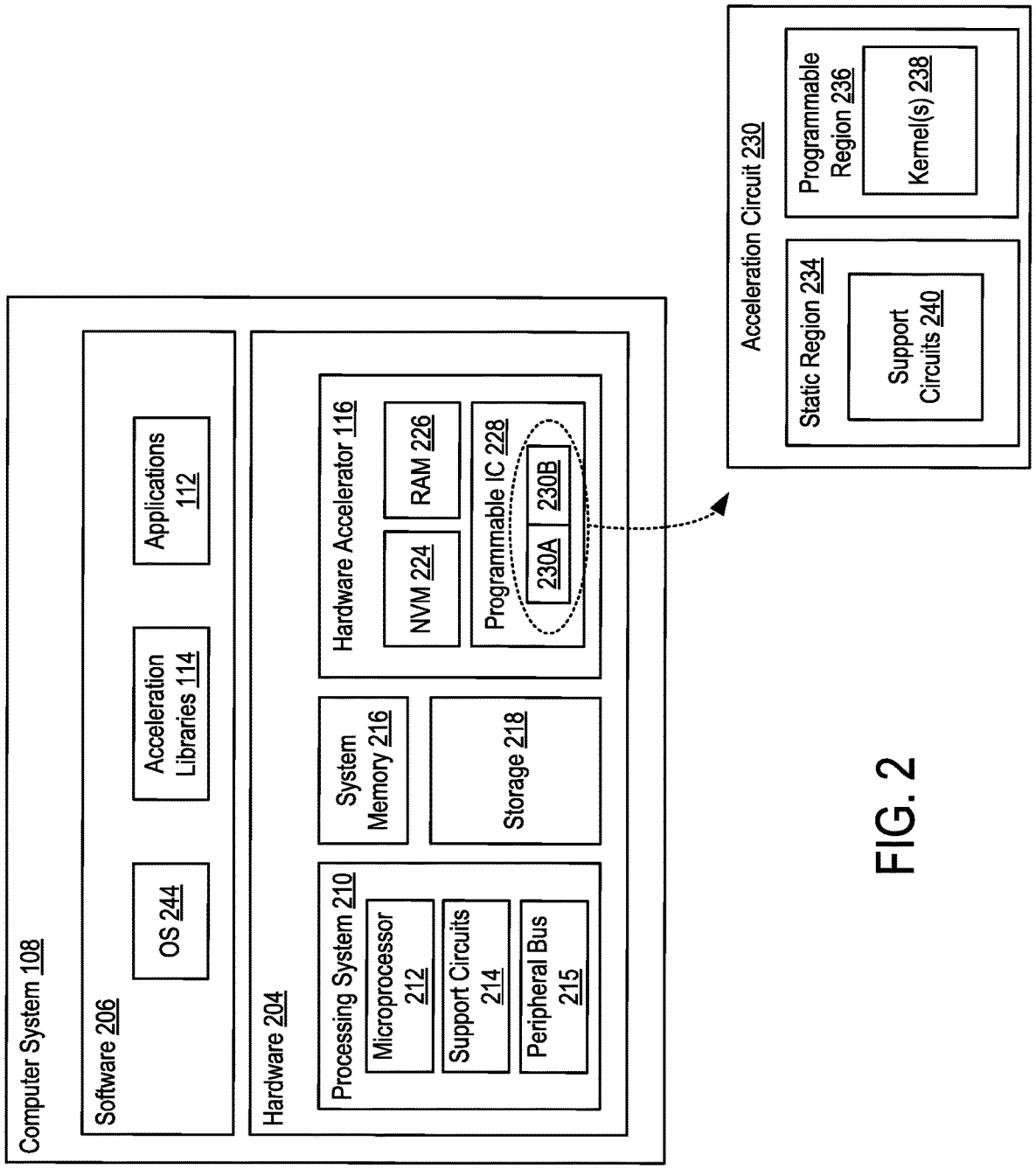
FIG. 2 is a block diagram depicting a computing system according to an example.

FIG. 2 is a block diagram depicting a computing system 108 according to an example. The computing system 108 includes hardware 204 and software 206 executing on the hardware 204. The hardware 204 includes a processing system 210, system memory 216, storage devices ("storage 218"), and a hardware accelerator 116. The software 206 includes an operating system (OS) 244, the acceleration libraries 114, and the applications 112. The processing system 210, system memory 216, and storage 218 comprise a host computer system as referenced herein.

The processing system 210 includes a microprocessor 212, support circuits 214, and a peripheral bus 215. The microprocessor 212 can be any type of general-purpose central processing unit (CPU), such as an x86-based processor, ARM®-based processor, or the like. The microprocessor 212 can include one or more cores and associated circuitry (e.g., cache memories, memory management units (MMUs), interrupt controllers, etc.). The microprocessor 212 is configured to execute program code that perform one or more operations described herein and which can be stored in the system memory 216 and/or the storage 218. The support circuits 214 include various devices that cooperate with the microprocessor 212 to manage data flow between the microprocessor 212, the system memory 216, the storage 218, the hardware accelerator 116, or any other peripheral device. For example, the support circuits 214 can include a chipset (e.g., a north bridge, south bridge, platform host controller, etc.), voltage regulators, firmware (e.g., a BIOS), and the like. The support circuits 214 manage data flow between the microprocessor 212 and the peripheral bus 215, to which various peripherals, such as the hardware accelerator 116, are connected. In some examples, the microprocessor 212 can be a System-in-Package (SiP), System-on-Chip (SoC), or the like, which absorbs all or a substantial portion of the functionality of the chipset (e.g., north bridge, south bridge, etc.). The peripheral bus can implement an expansion bus standard, such as Peripheral Component Interconnect Express (PCIe). In the example, the processing system 210 is shown separate from the hardware accelerator 116. In other examples discussed further below, the processing system 210 and the hardware accelerator 116 can be implemented on the same integrated circuit (IC) using a System-On-Chip (SoC).

The system memory 216 is a device allowing information, such as executable instructions and data, to be stored and retrieved. The system memory 216 can include, for example, one or more random access memory (RAM) modules, such as double-data rate (DDR) dynamic RAM (DRAM). The storage device 218 includes local storage devices (e.g., one or more hard disks, flash memory modules, solid state disks, and optical disks) and/or a storage interface that enables the computing system 108 to communicate with one or more network data storage systems. The hardware 204 can include various other conventional devices and peripherals of a computing system, such as graphics cards, universal serial bus (USB) interfaces, and the like.

The hardware accelerator 116 includes a programmable IC 228, a non-volatile memory 224, and RAM 226. The programmable IC 228 can be an FPGA or the like or an SoC having an FPGA or the like. The NVM 224 can include any type of non-volatile memory, such as flash memory or the like. The RAM 226 can include DDR DRAM or the like. The programmable IC 228 is coupled to the NVM 224 and the RAM 226. The programmable IC 228 is also coupled to the peripheral bus 215 of the processing system 210.

The OS 244 can be any commodity operating system known in the art, such as such as Linux®, Microsoft Windows®, Mac OS®, or the like. The acceleration libraries 114 includes drivers and libraries that provide APIs for command and control of the hardware accelerator 116. The applications 112 include software executing on the microprocessor 212 that invokes the APIs of the acceleration libraries 114 to implement neural network(s).

In operation, the programmable IC 228 is configured with an acceleration circuit 230. The acceleration circuit 230 generally includes a base platform 230A and a neural network accelerator 230B. For example, the acceleration circuit 230 can be implemented using a static region 234 and a programmable region 236. The static region 234 includes support circuits 240 for providing an interface to the peripheral bus 215, the NVM 224, and the RAM 226. The programmable region 236 can include one or more neural network accelerators ("kernel(s) 238"). The base platform 230A is implemented using the static region 234, and the neural network accelerator 230B is implemented using the programmable region 236. In another example, the base platform 230A can also be implemented using a portion of the programmable region 236. Thus, in some examples, the programmable region 236 also includes some interface circuits. In some examples, the acceleration circuit 230 can include more than one programmable region 236, each of which can be individually configured with neural network accelerator(s) 238.

The static region 234 is "static" in that the circuitry thereof remains constant across reconfigurations of the programmable region 236. In an example, the support circuits 240 include PCIe endpoint circuits, a direct memory access (DMA) controller, interconnects, a memory controller, a memory interface circuit (e.g., a DDR interface), decoupler circuits (to support partial reconfiguration), flash programmer, debug circuits, and the like. In some examples, the programmable region 236 does not include any of the support circuits 240. In other examples, some support circuits are implemented in the programmable region 236. In such case, the programmable region 236 can be referred to as an "expanded programmable region." In either case, in one example, some support circuits 240 are always present in the static region 234, such as the PCIe circuits and the DMA circuits.

Figure 3:
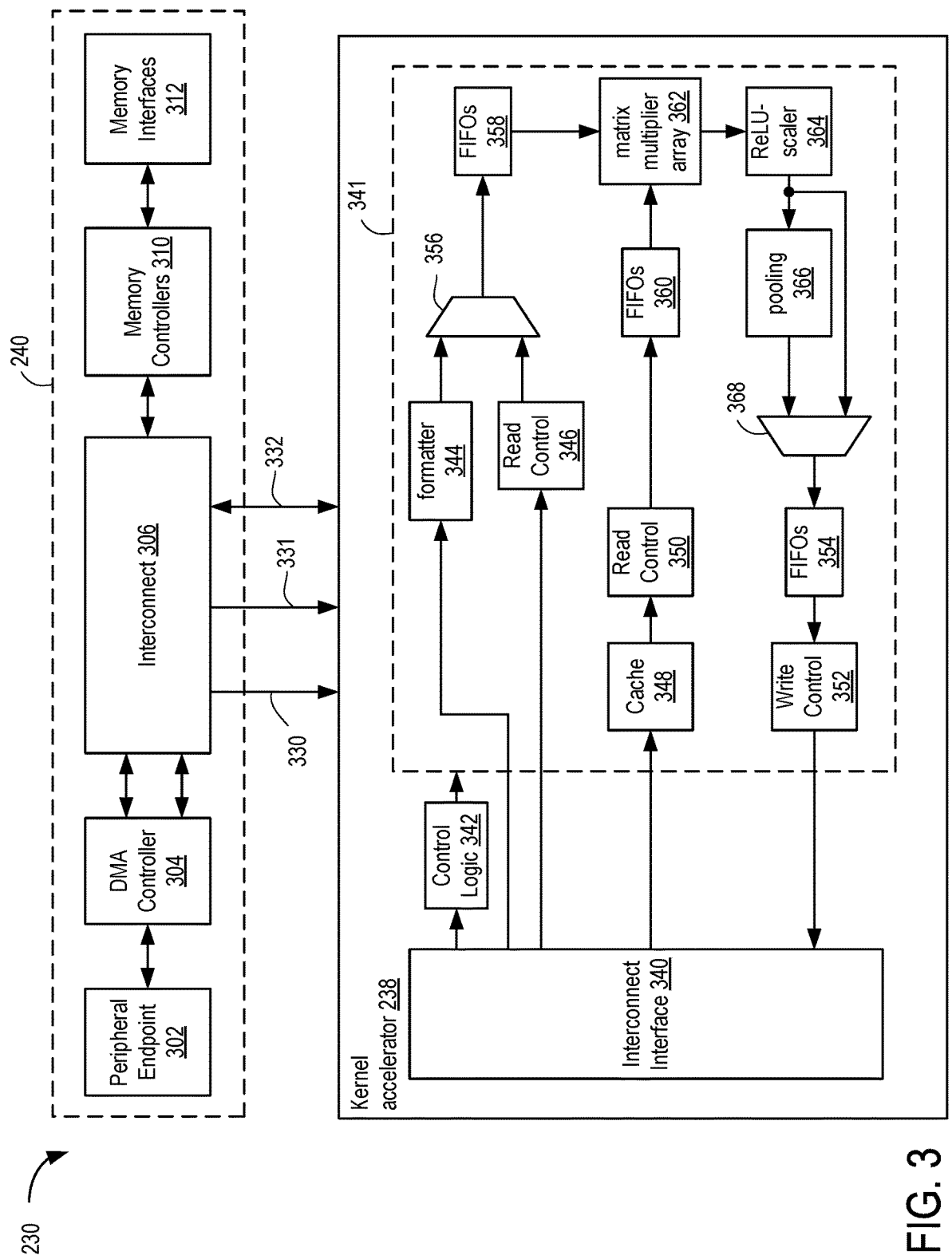
FIG. 3 is a block diagram depicting an acceleration circuit according to an example.

FIG. 3 is a block diagram depicting an acceleration circuit 230 according to an example. The acceleration circuit 230 includes the support circuits 240 and a neural network accelerator 238. In the example, the support circuits 240 include a PCIe endpoint circuit ("PCIe endpoint 302"), a PCIe DMA controller 304, interconnect circuits ("interconnect 306"), memory controllers 310, and memory interfaces 312. The support circuits 240 can include other circuits, which are omitted for clarity (e.g., decoupler circuits, debug circuits, etc.). The PCIe endpoint 302 provides a physical interface to the peripheral bus 215. The PCIe DMA controller 304 facilitates DMA operations to the RAM 226 and the neural network accelerator 238. The interconnect 306 couples the PCIe DMA controller 304 to the memory controllers 310 and to the neural network accelerator 238. The memory controllers 310 are coupled to the memory interfaces 312. The memory interfaces 312 are coupled to the RAM 226.

In operation, the acceleration libraries 114 can access the RAM 226 directly through the PCIe DMA controller 304. The acceleration libraries 114 can also access the neural network accelerator 238 through the PCIe DMA controller 304. The neural network accelerator 238 can access the RAM 226 through the memory controllers 310. Data can be exchanged between the software 206 and the neural network accelerator 238 using DMA operations between the system memory 216 and the RAM 226.

In the example, the neural network accelerator 238 uses interfaces 330, 331, and 332 to the interconnect 306. In particular, the these interfaces include a first read interface 330, a second read interface 331, and a read/write interface 332. For example, the read interface 330 can be used as a control interface for controlling the neural network accelerator 238. The read interface 331 can be used to read from the RAM 226 through a first one of the memory interfaces 312. The read/write interface 332 can be used to read and write from the RAM 226 through a second one of the memory interfaces 312.

The neural network accelerator 238 includes an interconnect interface 340, control logic 342, and processing circuits 341. The processing circuits 341 include a formatter circuit 344 circuit (e.g., IM2COL), a read control circuit ("read control 346"), a multiplexer 356, first-in-first-out circuits ("FIFOs 358"), matrix multiplier array 362, a ReLU-scaler circuit 364, a pooling circuit 366 (e.g., maxpool), a multiplexer 368, FIFOs 354, write control circuit ("write control 352"), a cache 348, a read control circuit ("read control 350"), and FIFOs 360. The interconnect interface 340 is coupled to the interfaces 330, 331, and 332, the control logic 342, and the processing circuits 341. The interconnect interface 340 can include switches, clock converters, and the like to facilitate communication between the control logic 342 and the interface 330, as well as between the processing circuits 341 and the interfaces 331 and 332.

In the example, the interconnect interface 340 is coupled to inputs of the formatter circuit 344, the read control circuit 346, the cache 348, and the write control circuit 352. Outputs of the formatter circuit 344 and the read control circuit 346 are coupled to inputs of the multiplexer 356. An output of the multiplexer 356 is coupled to an input of the FIFOs 356. An output of the FIFOs 356 is coupled to a first input of the matrix multiplier array 362. An output of the cache 348 is coupled to an input of the read control circuit 350. An output of the read control circuit 350 is coupled to an input of the FIFOs 360. An output of the FIFOs 360 is coupled to a second input of the matrix multiplier array 362. An output of the matrix multiplier array 362 is coupled to an input of the ReLU-scaler 364. An output of the ReLU-scaler 364 is coupled to an input of the pooling circuit 366 and an input of the multiplexer 368. An output of the pooling circuit 366 is coupled to another input of the multiplexer 368. An output of the multiplexer 368 is coupled to an input of the FIFOs 354. An output of the FIFOs 354 is coupled to the write control circuit 352.

In operation, the matrix multiplier array 362 performs matrix multiplication operations for implementing a neural network. The inputs of the matrix multiplier array 362 receive input activation matrices from the FIFOs 358 and weight matrices from the FIFOs 360. The input activation matrices can be read directly from the RAM 226 using the read control circuit 346. Alternatively, the input activations can be read from the RAM 226 and processed by the formatter circuit 344 for input to the matrix multiplier array 362. Weight matrices can be read from the RAM 226 by the read control circuit 350 and cached in cache 348. The ReLU-scaler 364 performs and activation function and can scale the output of the matrix multiplier array 362. The pooling circuit 366 can implement a max pooling function on the scaled output of the matrix multiplier array 362. In one example, the pooling circuit 366 is implemented using CLBs or other configurable logic. Either the output of the pooling circuit 366 or the ReLU-scaler 364 can be stored in the FIFOs 354. The write control circuit 352 writes data in the FIFOs to the RAM 226. The control logic 342 controls the various circuits in the processing circuits 341, such as the formatter circuit 344, the read control circuit 346, the multiplexers 356 and 368, the read control circuit 350, and the ReLU-scaler 364, the pooling circuit 366, and the write control circuit 352.

Figure 4:
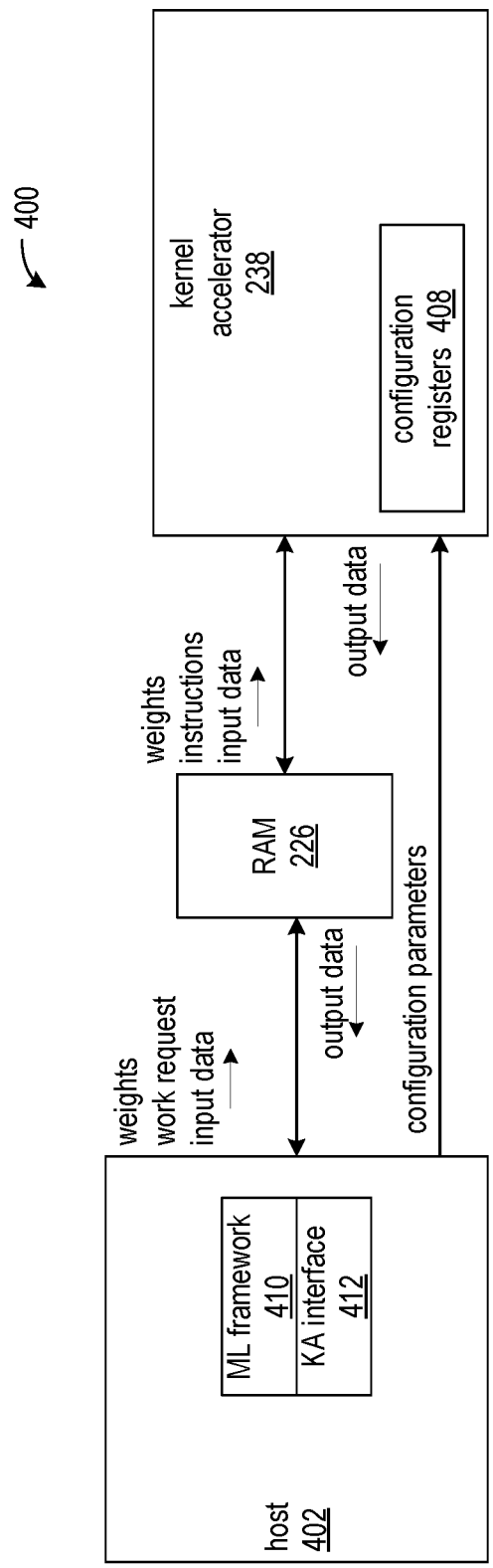
FIG. 4 shows an exemplary neural network processing system according to one implementation.

FIG. 4 shows an exemplary neural network processing system 400 according to one implementation. The system includes a host computer system 402 communicatively coupled to neural network accelerator 238. The host computer system 402 can include the processing system 210, system memory 216, and storage 218 as shown in FIG. 2.

The host computer system 402 is specifically programmed by a machine learning (ML) framework 410 and a neural network accelerator (KA) interface 412. The ML framework program, which corresponds to the applications 112 of FIG. 1, specifies a particular neural network application, for example, image or speech processing, and the KA interface, which can be implemented as the acceleration libraries as in FIG. 1, initiates neural network operations on the neural network accelerators in response to requests for neural network processing from the ML framework. The neural network accelerator 238 is coupled to RAM 226, through which the host and neural network accelerator communicate. The neural network accelerator has a set of configuration registers 408. The configuration registers are accessible to the KA interface 412 for storing addresses of memory buffers in the RAM 226 and configuration parameters for neural network operations, such as matrix dimensions for general matrix multiplication (GEMM) and the stride/window for convolution.

The disclosed approaches are not limited to any specific hardware platforms. However, for purposes of providing a frame of reference to those skilled in the art, the neural network accelerator can be implemented on a KINTEX® ULTRASCALE™ 115 device, which is available from Xilinx, Inc. The RAM 226 is a DDR SDRAM mounted on a printed circuit board along with the neural network accelerator. The interface between host 402 and the RAM 226, and between the host and the neural network accelerator 238 is Peripheral Component Interconnect Express (PCIE). The neural network accelerator uses direct memory access (DMA) channels to map some of the host memory to the RAM 226 and to configuration registers 408. The host computer system 402 can be any computer system or combination of network of computer systems suitable for executing an ML framework 410 and KA interface 412. ML frameworks can be specified using programming packages such as TENSORFLOW™, Caffe, and MXNet.

The KA interface 412 receives requests from the ML framework 410 for neural network processing by the neural network accelerator 238. Prior to submitting requests to the neural network accelerator 238 for processing, the KA interface writes the weight matrices associated with the layers of the neural network to the RAM 226 that is shared with the neural network accelerator. All of the weight matrices are written to the shared memory as a contiguous block, which reduces the number of DMA operations and overhead and ensures that the weights are available to the neural network accelerator when the weights are needed for the convolutions or matrix multiplications in the layers of the neural network.

In response to receiving a neural network request from the ML framework 410, the KA interface 412 assembles a work request that specifies parameter values and operations to perform for a layer of the neural network and writes the work request to the RAM 226. Each work request specifies a respective offset of a weight matrix from the base address of the combined weight matrices in the RAM. The processing of each layer of the neural network will access a respective one of the weight matrices. Each work request also specifies configuration parameters for different neural network operations in the referenced layers. For example, the configuration parameters can specify a scaling factor, convolution window and stride, matrix dimensions for max-pool processing, and an activation function. Different layers of the neural network can entail different sets of neural network operations.

The KA interface 412 further establishes configuration parameters in the configuration registers 408 of the neural network accelerator. The configuration parameters include the base address of the weight matrices, the base address of the input/output data matrices, and an offset from the base address of the input/output data matrices. A weight matrix is sometimes referred to as "A," an input data matrix is sometimes referred to as "B," and the output data matrix is sometimes referred to as "C."

In response to a signal from the KA interface 412 indicating that a work request is ready to be processed, the neural network accelerator 238 uses the values of the configuration registers 408 and parameters values of the work request to control the operations of the layer of the neural network performed on the input data. The host waits until the neural network accelerator signals completion of performing the operations before instructing the neural network accelerator to commence performing the neural network operations of the next layer. In response to the neural network accelerator signaling completion of layer i, the host prepares a work request for layer i+1. The work request for layer i+1 instructs the neural network accelerator to use the results data matrix in the shared memory from layer i as an input data matrix for layer i+1. After the neural network accelerator has completed the neural network operations of the last layer of the neural network, the host copies the results data matrix from the shared memory to the host memory.

In systems having multiple neural network accelerators 238 controlled by the same KA interface 412, the KA interface can direct different ones of the neural network accelerators to perform the operations of different layers of the neural network. The KA interface controls and tracks the locations in the RAM 226 of the buffers that store the results data matrices generated by the neural network accelerator(s). The KA interface maintains a database that associates key values with locations of output buffers in the RAM 226. The key values can be generated based on identifiers provided by the ML framework, identifiers of the neural network accelerators, and the neural network layer of the current request.

When constructing the work request for each layer of neural network operations, the KA interface 412 generates a key value and allocates an output buffer in the RAM 226 in which the neural network accelerator 238 stores output data. The KA interface stores in a database in memory of the host, the key value in association with an identifier of the neural network accelerator and the address of the output buffer. The ML framework invokes the KA interface with an input identifier and an output identifier. If the input identifier is non-NULL, the KA interface determines a key value based on the input identifier and looks up the address associated with the key value in the database. The address read from the database is used in the work request to the neural network accelerator to specify the address of the input data matrix. If the input identifier is NULL or some other predetermined value, the KA interface copies the input data matrix from host memory to the RAM 226 and provides the address of the input data matrix in the work request to the neural network accelerator.

Figure 5:
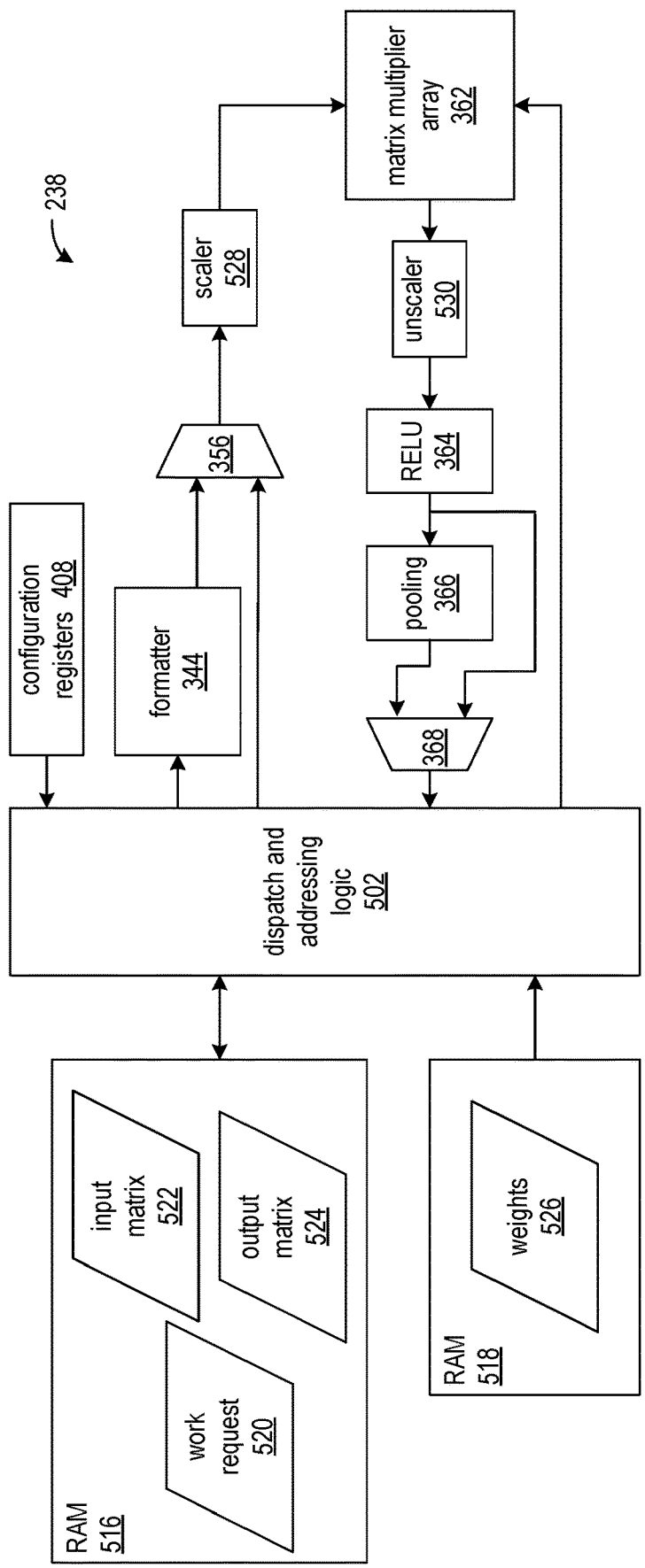
FIG. 5 shows another view of the exemplary neural network accelerator shown in FIG. 3.

FIG. 5 shows another view of the exemplary neural network accelerator 238 of FIG. 3. The neural network accelerator 238 includes configuration registers 408, dispatching and addressing logic circuitry 502 (that implement the read and write controls of FIG. 3), formatter circuit 344, matrix multiplier circuitry 362, rectifier liner unit circuit (RELU) circuit 364, and pooling circuitry 366. Multiplexers 356 and 368 are controlled by the dispatch and addressing logic according to the specified neural network operations. In the exemplary implementation, the neural network accelerator 238 is coupled to two DDR RAMs 516 and 518. RAM 516 stores a work request 520, an input data matrix 522, and an output data matrix 524. RAM 518 stores a weights matrix 526.

The neural network accelerator 238 further includes scaler circuit 528 and unscaler circuit 530. An implementation of the matrix multiplier array performs fixed point multiplication, and in order to avoid arithmetic overflow in neural network applications in which the output of one layer is the input to the next layer, the input values to the matrix multiplier are scaled to a range that will not cause overflow in the computations of the next layer.

The scaling factor(s) can be determined through prior analysis of the range of possible values of the input data and matrix data in each layer of the neural network.

As an example using 16-bit fixed point, the matrix multiplier 362 performs a matrix multiplication of matrices A1 and B1:

$$C1 = A1 * B1$$

If A1 has a maximum input range of −15.8 to 17.5, 17.5 is used to create a scaling value of 2^15/17.5=1872.4, which when multiplied by all the values in A1 will adjust them to the 16-bit range and preserve one sign bit. For this example the fixed precision number is treated as an integer without fractional bits. If having fractional bits were desired for some reason, smaller scaling values could be used. We call the first scaling factor "scaleA1." The same operations can be performed on the B1 inputs with the range for B1 to generate "scaleB1."

The A1 and B1 inputs are scaled by scaleA1 and scaleB1, and the floating point NN layer is rerun to assess the maximum range of the dot product result. If, for example, 32-bit values are to be accumulated, and if any dot product output exceeds a 32-bit representation, a scaling factor of 2^31/val is used to determine a reduction scaling factor that would reduce the range of the A1 and B1 inputs. The square root of that value is multiplied by scaleA1 and multiplied by scaleB1 to produce scaleA1' and scaleB1' which when applied to the original floating point number ensures the fixed-precision dot product does not exceed 32 bits.

Every layer on the deep learning network is analyzed in this manner producing scaling factors for each layer. The hardware for scaling between layer N and N+1 is general enough to scale between any sequence of layers.

B2 is the input for the next layer, and B2=C1. After applying scaling values and instead of computing C1=A1*B1, the computation is (scaleA1'*A1)* (scaleB1'*B1). The scaling result is divided by (scaleA1'*scaleB1') to get C1 and undo the scaling. Since B2=C1 the next step would be to scale by scaleB2' in preparation for calculating layer 2. If combining the scaling on the output of layer 1 and the input of layer 2, the layer 1 dot product outputs are scaled by scaleB2'/ (scaleA1'*scaleB1').

Combining the output scaling factors from layer N with the input scaling factors for layer N+1, the scaling factor is approximated into the form x/2^y. This term can be implemented very efficiently as hardware in the FPGA yet can describe scaling factors with high precision.

In describing the scaling factors in the form x/2^y, arbitrary precision scaling can be implemented using a single multiply operation. Normally division is a complicated operation so describing the denominator as 2^y means the y value is actually describing a right shift of the input value. If y is a constant there are no muxes or any logic actually created so it is very efficient. Right shift by a constant can be implemented by rewiring of the input to output bus. The architecture also features one right shift by y, a multiplication by x, and a second right shift after the multiplication.

The scaler circuit 528 multiplies the values in the input weights matrix by the scaleA1 factor, and multiplies the input data values by the scaleBx factor (where "x" is the layer). The unscaler circuit 530 unscales the output values from the matrix multiplier array by dividing each output value by (scaleA1*scaleBx).

The neural network accelerator 238 can also perform layer-dependent, light-weight data matrix processing before performing the current neural network operations of a layer. Before initiating light-weight inter-layer processing prior to the next layer, the neural network accelerator performs a matching reverse operation on the result values from the current layer. An example is handling two 8-bit operations in one 16-bit fixed point data slot.

The matrix multiplier array 362 performs arithmetic operations on 16-bit image values. A 2× performance improvement can be achieved by submitting two parallel jobs as two 8-bit images values in one 16-bit slot. The pre-processing entails packing two 8-bit image values into one 16-bit slot. Post-processing entails unpacking the two 8-bit output values. The pre-processing and post-processing steps are executed around a main operation, such as convolution. The light-weight pre-processing and post-processing is layer-dependent, because maxpooling dimensions differ from layer to layer and ReLU is applied to some layers and not applied to other layers. The scaler circuit 528 can perform the light-weight pre-processing, and the unscaler circuit 530, ReLU circuit 364 and/or pooling circuit 366 can perform the light-weight post processing.

The dispatch and addressing circuit 502 reads the work request 520 and initiates the specified neural network operations with the data referenced in the work request. The dispatch and addressing circuit controls multiplexer 356 to select between input data read from the RAM 516 and formatted data from formatter circuit 344. The formatter circuit 344 translates input data from a format provided by the ML framework to a format suitable for the matrix multiplier circuit 362. For example, in one implementation, the formatter circuit converts image data into column data (im2col). In another implementation it translates row-major or column-major format to a custom hybrid row/column major format that matches the compute array geometry. The matrix multiplier 362 performs matrix multiplication between the input data and the weights matrix 526. In one implementation, the matrix multiplier circuit is a systolic array of multiplier-accumulator circuits. RELU circuit 364 implements an activation function and a scaling function for the neural network. The pooling circuit 366 reduces the spatial size of the data between convolution layers in order to reduce the computational requirements imposed on successive layers. Reduction of the spatial size also aids in avoiding overfitting. In an exemplary application, the pooling circuit implements the maxpool function. The dispatch and addressing circuit controls multiplexer 368 to select between data from the RELU and scaling circuit 364 and data from the pooling circuit 366 for storing as the output matrix 524.

Figure 6:
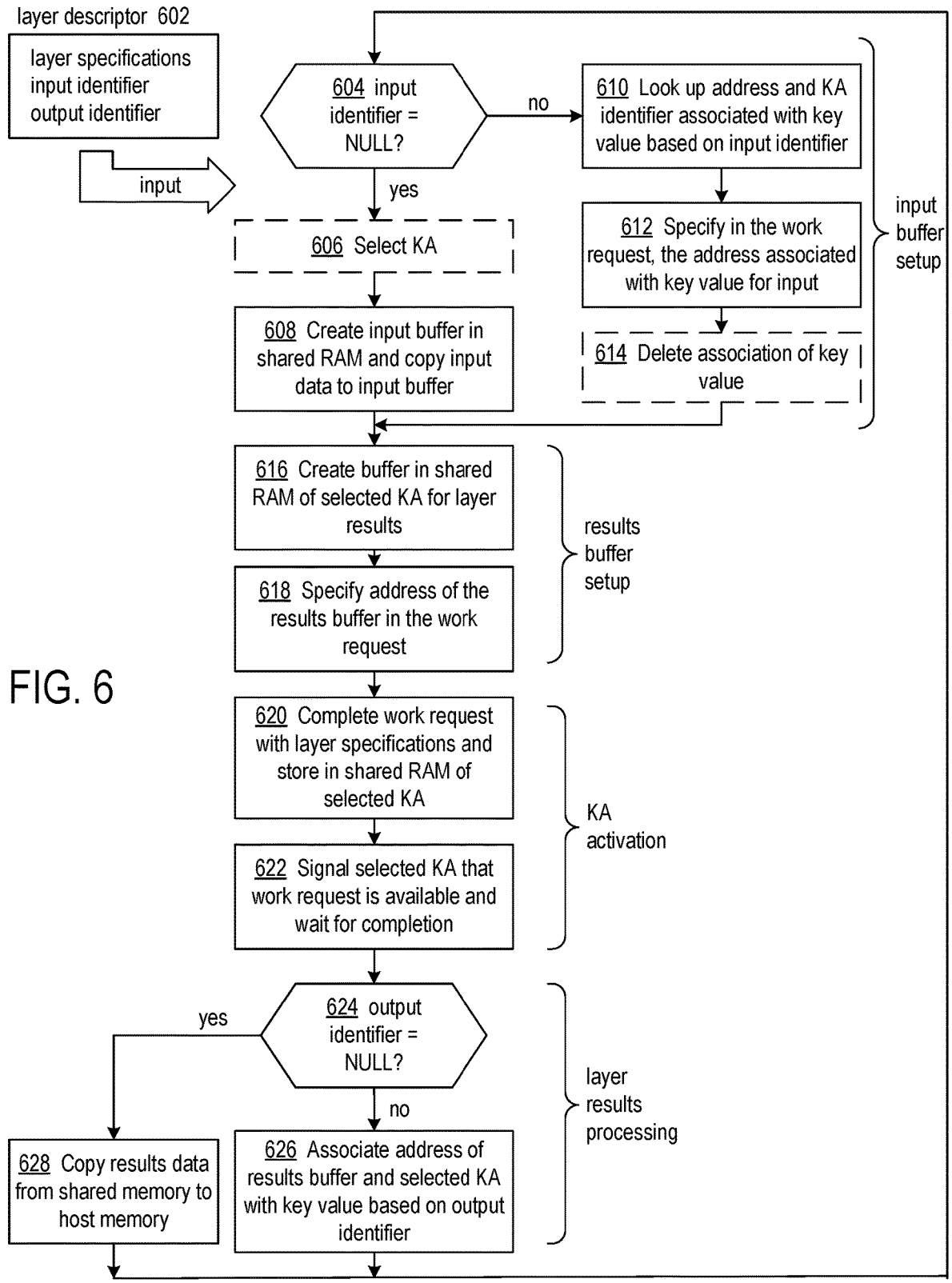
FIG. 6 is a flowchart of an exemplary process of host-directed processing of layers of a neural network by way of per-layer work requests to a neural network accelerator.

FIG. 6 is a flowchart of an exemplary process of host-directed processing of layers of a neural network by way of per-layer work requests to a neural network accelerator 238. In one implementation, the ML framework 410 inputs a layer descriptor 602 to the KA interface 412, and the KA interface constructs a work request for the neural network accelerator 238 based on the contents of the layer descriptor. The ML framework inputs one layer descriptor for each layer.

Each layer descriptor specifies the neural network operations to be performed (e.g., image-to-column (im2col) formatting, maxpool, and ReLU), dimensions of input and weights matrices, and input and output identifiers, which are used by the KA interface 412 to determine shared memory addresses of input and output buffers. The layer descriptor can also specify the number of rows in the weight matrix (A), the number of rows in the output matrix (C), and the number of columns of the image matrix (B) and output matrix C. The layer descriptor can further specify the number of columns of A and rows of B, a scaling factor used to scale the computed values, the number of channels in the input data, and the padding of input data to align with data sizes needed by the compute array.

The input identifier and output identifier in the layer descriptor provided by the ML framework 410 to the KA interface 412 identify the input data matrix and the results data matrix to the KA interface. In an exemplary implementation, the input identifier and output identifier are character strings. The KA interface 238 allocates a buffer in the RAM 226 for each results data matrix, generates a key value based at least on part on the output identifier, and associates the key value with the address of the buffer. The ML framework can direct the KA interface and neural network accelerator to use the results data matrix from one layer (i) as the input data matrix in the next layer (i+1) by specifying the output identifier of layer i as the input identifier of layer i+1.

As an example, an application in the ML framework 410 can specify a vector of layer descriptors, with each layer descriptor in the vector specifying operations and parameters for the operations of one of the layers of the neural network. The ML framework can then call the KA interface 412 multiple times to process the layer descriptors in the vector. An exemplary specification of the input identifiers and output identifiers in each five layer descriptors can be as follows, assuming each layer descriptor is specified as a character string and the input identifier is specified first followed by the output identifier:
  layer 1 descriptor: " ", "conv2"
  layer 2 descriptor: "conv2", "conv3"
  layer 3 descriptor: "conv3", "conv4"
  layer 4 descriptor: "conv4", "conv5"
  layer 5 descriptor: "conv5", " "
In the exemplary layer descriptors, the output identifier from layer i is used as the input identifier in layer i+1, as can be seen by the output identifier "conv2" in the layer 1 descriptor being the input identifier in the layer 2 descriptor. Specifying the output identifier from layer i as the input identifier in layer i+1 provides a mechanism for maintaining the results data matrix from layer i in the RAM 226 for use as the input data matrix to layer i+1, which greatly reduces the quantity of data transferred between the host and the RAM 226.

The value of the input identifier and output identifier can be used to signal to the KA interface 412 to transfer data between the host memory and the RAM 226 such as for providing the input data matrix for the first layer and retrieving the results data matrix from the last layer. In an exemplary implementation, a NULL character string can be used to signal a data transfer. In response to the input identifier being a NULL character string, the KA interface copies the input data matrix from host memory to the RAM 226, and in response to the output identifier being NULL, the KA interface copies the results matrix from the RAM 226 to the host memory when the neural network accelerator 238 signals completion. Alternative implementations can use other values, for example integers, as input and output identifiers and to signal when data transfer is required.

At decision block 604, the KA interface 412 determines whether or not the input identifier is a NULL character string, such as would be input for the layer descriptor of the first layer of the neural network. If the input identifier is NULL, at block 606, the KA interface optionally selects a neural network accelerator 238 to perform the specified neural network operations of the layer. In systems having only one neural network accelerator, no selection would be performed. In systems having multiple neural network accelerators and the neural network accelerators having different capabilities, such different sizes of matrix multiplier arrays, the KA interface can select the neural network accelerator having capabilities suitable for the size of the input data matrix. At block 608, the KA interface creates an input buffer in the shared RAM 226 and copies the input data matrix to the input buffer.

If the input identifier is not NULL, at block 610, the KA interface determines the key value based at least in part on the value of the input identifier and looks up the address of the input buffer in a database having associations between key values and buffer addresses. The input identifier can be a unique string manually specified by the user, the memory address of the input to a neural network operation, or a cyclic redundancy check (CRC) signature of exact definition of neural network operation. e.g., "maxpool of layer 3 in inception branch 2."

Figure 7:
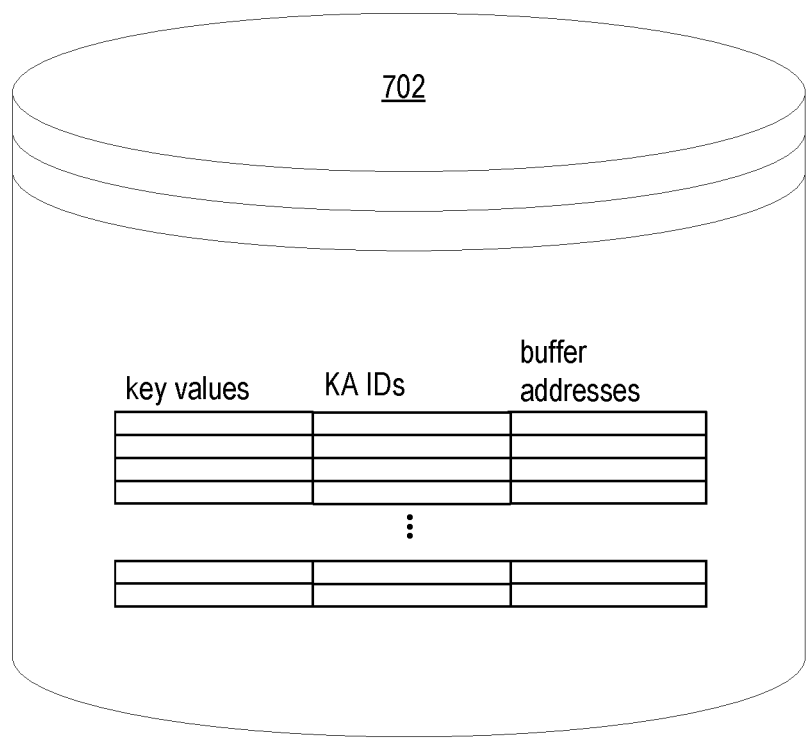
FIG. 7 shows an exemplary database of key values and associated buffer addresses.

At block 612, the KA interface specifies the address of the input buffer in the work request to be submitted to the neural network accelerator. In some embodiments, once a buffer address associated with a key value has been specified in a work request for use as an input buffer, the database entry can be optionally deleted. Deleting the entry from the database reduces memory usage on both the host and the KA. Selectively not-deleting is to enable reuse of data for faster system performance Turning briefly to FIG. 7, FIG. 7 shows an exemplary database 702 of key values and associated buffer addresses. The database can be stored in host memory 216. In systems having multiple neural network accelerators, the database can also specify the identifiers of the neural network accelerators. The neural network accelerator ID associated with a key value and buffer address indicates the particular neural network accelerator that will access the buffer in performing the neural network operations of a layer.

Returning now to FIG. 6, at block 616 the KA interface 412 allocates memory in shared RAM 226 of the selected neural network accelerator 238 for an output buffer to contain the output results matrix generated by the neural network accelerator. At block 618, the KA interface specifies the address of the output buffer in the work request. The KA interface completes the work request with the layer specification from the layer descriptor and stores the complete work request in the RAM 226 at block 620. At block 622, the KA interface signals the neural network accelerator that a work request is available and then waits for a completion signal from the neural network accelerator.

Once the neural network accelerator signals completion of processing a layer of the neural network, the KA interface commences results processing. At decision block 624, the KA interface determines whether or not the output identifier in the layer descriptor is NULL. If the output identifier is not NULL, the output results matrix remains in the buffer in the shared RAM 226 for input to another layer of processing, and at block 626 the KA interface stores the address of the output buffer in the database 702 in association with the key value that is based at least in part on the output identifier. At block 628, if the output identifier is NULL, the data in the output buffer is the output data matrix from the last layer of neural network processing, and the data from the buffer is copied from the shared RAM 226 to the host memory 216. The process then returns to decision block 604 to process the next layer descriptor from the application in the ML framework.

Figure 8:
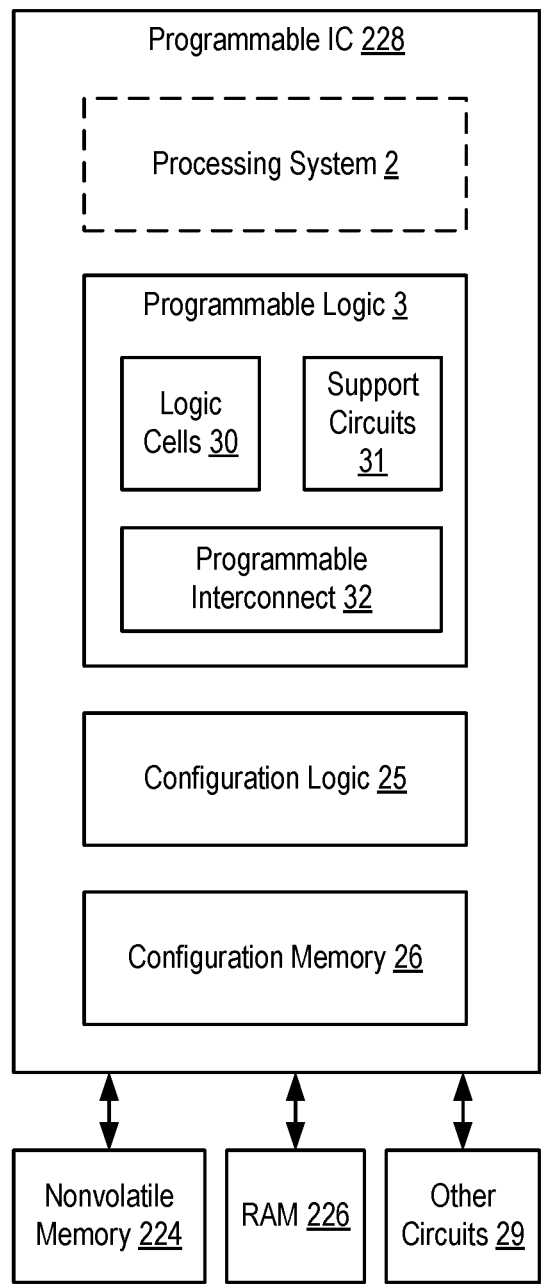
FIG. 8 is a block diagram depicting a programmable IC according to an example.

FIG. 8 is a block diagram depicting a programmable IC 228 according to an example. The programmable IC 228 includes programmable logic 3, configuration logic 25, and configuration memory 26. The programmable IC 228 can be coupled to external circuits, such as the NVM 224, the RAM 226, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 224 or any other source (e.g., the DRAM 226 or from the other circuits 29). In some examples, the programmable IC 228 includes a processing system 2. The processing system 2 can include microprocessor(s), memory, support circuits, IO circuits, and the like. For example, the processing system 2 can include circuits similar to the processing system 210. In some examples, the processing system 2 can be used in place of the processing system 210. In such case, the entire computing system 108 can be implemented using the programmable IC 228, where the software 206 executes on the processing system 2.

Figure 9:
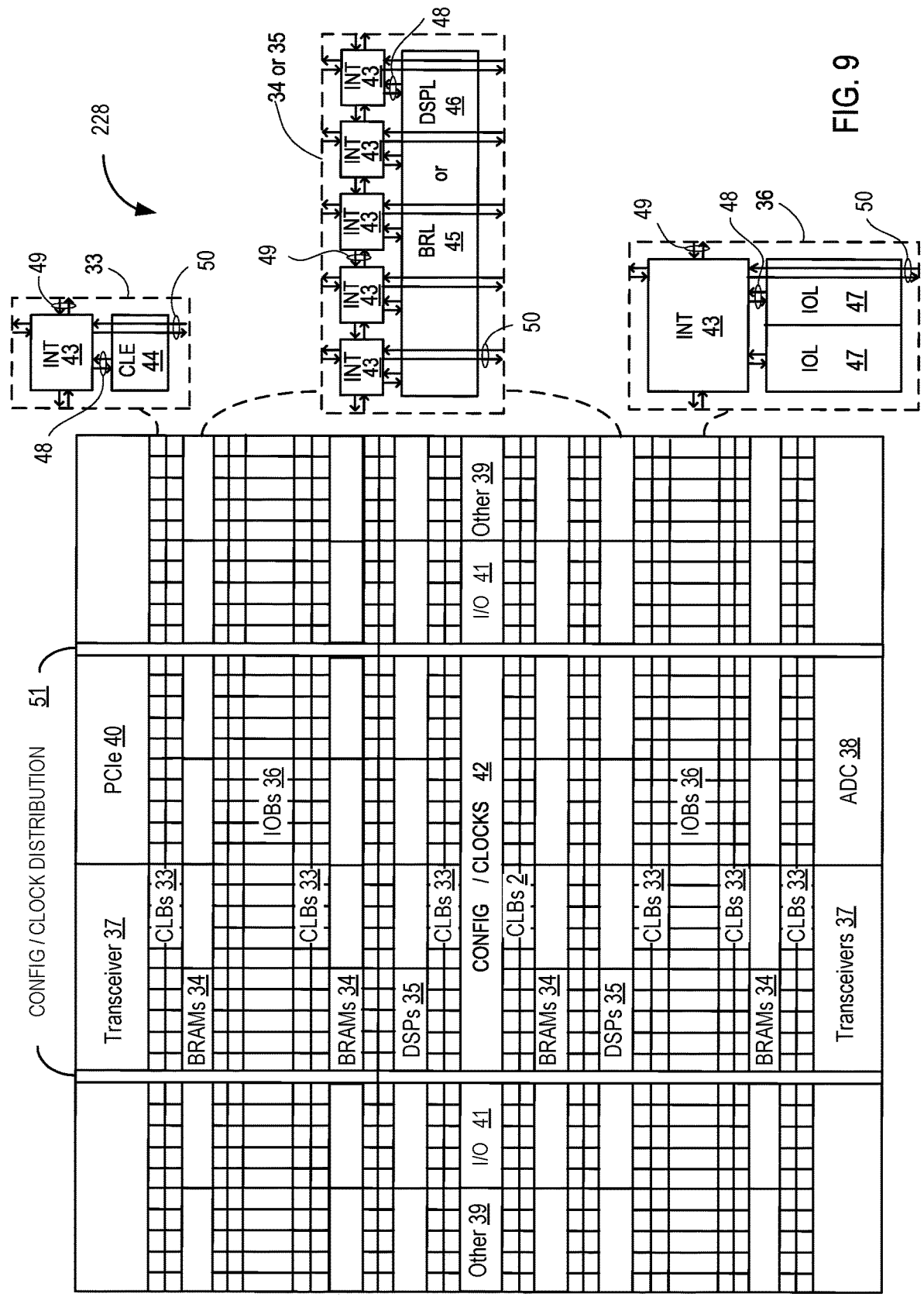
FIG. 9 illustrates an FPGA implementation of a programmable IC.

FIG. 9 illustrates an FPGA implementation of the programmable IC 228 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 9. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for neural network processing. Other aspects and features will be apparent to those skilled in the art from consideration of the specification. It is intended that the specification and drawings be considered as examples only, with a true scope of the invention being indicated by the following claims.

What is claimed is:

1. A method comprising:
   copying by a host computer system, an input data matrix from host memory to a shared memory for performing neural network operations of a first layer of a plurality of layers of a neural network by a neural network accelerator;
   instructing the neural network accelerator by the host computer system to perform neural network operations of each layer of the neural network beginning with the input data matrix;
   performing neural network operations of each layer of the neural network by the neural network accelerator in response to the instructing;
   waiting by the host computer system until the neural network accelerator signals completion of performing neural network operations of layer i before instructing the neural network accelerator to commence performing neural network operations of layer i+1, for i≥1; and
   instructing the neural network accelerator by the host computer system to use a results data matrix in the shared memory from each layer i of the plurality of layers as an input data matrix for layer i+1 for i≥1, wherein the instructing includes:
      inputting by the host computer system an input identifier and an output identifier for layer i+1, wherein the input identifier references the results data matrix of layer i,
      determining a first key value from the input identifier,
      looking up in a database, a first address associated with the first key value,
      allocating space for an output buffer at a second address in the shared memory for a results data matrix generated by layer i+1, and
      communicating the first address and the second address to the neural network accelerator; and
   storing in the database in the host memory by the host computer system, the second address in association with a second key value that is based on the output identifier, in response to the neural network accelerator signaling completion of performing neural network operations of layer i+1.

2. The method of claim 1, further comprising copying by the host computer system, a results data matrix from the shared memory to the host memory in response to completion of neural network operations of a last layer of the neural network.

3. The method of claim 1, further comprising deleting the association between the key value and an address of the buffer after instructing the neural network accelerator to use data at the address associated with the key value based on the input identifier as the input data matrix in performing the neural network operations of layer i.

4. The method of claim 1, further comprising:
   scaling values from an input data matrix to a layer by a layer-specific scaling factor before performing neural network operations of a current layer; and
   unscaling result values from the current layer before initiating scaling of values from an input data matrix to a next layer.

5. The method of claim 4, further comprising:
   performing layer-dependent, light-weight processing of the input data matrix before performing the neural network operations of the current layer; and
   performing a reversal of the layer-dependent, light-weight processing on the results data matrix before initiating layer-dependent, light-weight processing of a next layer.

6. The method of claim 1, further comprising:
   writing by the host computer system, a plurality of weight matrices associated with a plurality of layers of the neural network to contiguous address space in the shared memory; and communicating from the host computer system to the neural network accelerator a parameter indicative of a base address in the shared memory of the weight matrices and a plurality of offset values indicating respective locations of the plurality of weight matrices.

7. The method of claim 1, further comprising:
wherein the copying the input data matrix from host memory to the shared memory is in response to a particular value of the input identifier; and
copying by the host computer system, the results data matrix from the output buffer in the shared memory to the host memory in response to completion of neural network operations of a last layer of the neural network and a particular value of the output identifier.

8. A neural network processing system, comprising:
a shared memory;
a host computer system coupled to the shared memory, wherein the host computer system is configured with instructions that when executed cause the host computer system to:
copy an input data matrix from host memory to the shared memory for performing neural network operations of a first layer of a plurality of layers of a neural network by a neural network accelerator;
instruct the neural network accelerator to perform neural network operations of each layer of the neural network beginning with the input data matrix;
wait until the neural network accelerator signals completion of performing neural network operations of layer i before instructing the neural network accelerator to commence performing neural network operations of layer i+1, for i≥1; and
instruct the neural network accelerator to use a results data matrix in the shared memory from each layer i of the plurality of layers as an input data matrix for layer i+1 for i≥1, wherein the instructing includes:
input an input identifier and an output identifier for layer i+1, wherein the input identifier references the results data matrix of layer i,
determine a first key value from the input identifier,
look up in a database, a first address associated with the first key value,
allocate space for an output buffer at a second address in the shared memory for a results data matrix generated by layer i+1, and
communicate the first address and the second address to the neural network accelerator; and
store in the database in the host memory, the second address in association with a second key value that is based on the output identifier, in response to the neural network accelerator signaling completion of performing neural network operations of layer i+1; and
the neural network accelerator coupled to the shared memory and to the host computer system, wherein the neural network accelerator is configured to:
perform neural network operations of each layer of the neural network in response to the instructing.

9. The system of claim 8, wherein the host computer system is configured with further instructions that when executed cause the host computer system to copy a results data matrix from the shared memory to the host memory in response to completion of neural network operations of a last layer of the neural network.

10. The system of claim 8, wherein the host computer system is configured with further instructions that when executed cause the host computer system to delete the association between the key value and an address of the buffer after instructing the neural network accelerator to use data at the address associated with the key value based on the input identifier as the input data matrix in performing the neural network operations of layer i.

11. The system of claim 8, wherein the neural network accelerator is further configured to:
scale values from an input data matrix to a layer by a layer-specific scaling factor before performing neural network operations of a current layer, and
unscale result values from the current layer before initiating scaling of values from an input data matrix to a next layer.

12. The system of claim 11, wherein the neural network accelerator is further configured to:
perform layer-dependent, light-weight processing of the input data matrix before performing the neural network operations of the current layer; and
perform a reversal of the layer-dependent, light-weight processing on the results data matrix before initiating layer-dependent, light-weight processing of a next layer.

13. The system of claim 8, wherein the host computer system is configured with further instructions that when executed cause the host computer system to:
write a plurality of weight matrices associated with a plurality of layers of the neural network to contiguous address space in the shared memory, and
communicate to the neural network accelerator a parameter indicative of a base address in the shared memory of the weight matrices and a plurality of offset values indicating respective locations of the plurality of weight matrices.

14. The system of claim 8, wherein the host computer system is configured with further instructions that when executed cause the host computer system to:
copy the input data matrix from host memory to the shared memory in response to a particular value of the input identifier, and
copy the results data matrix from the output buffer in the shared memory to the host memory in response to completion of neural network operations of a last layer of the neural network and a particular value of the output identifier.

* * * * *